US008542493B2

(12) United States Patent
Abe et al.

(10) Patent No.: US 8,542,493 B2
(45) Date of Patent: Sep. 24, 2013

(54) FLAT DISPLAY APPARATUS AND HIGH-VOLTAGE POWER SUPPLY

(75) Inventors: Naoto Abe, Machida (JP); Eisaku Tatsumi, Kawasaki (JP); Tatsuya Nakajima, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 736 days.

(21) Appl. No.: 12/835,851

(22) Filed: Jul. 14, 2010

(65) Prior Publication Data

US 2011/0025672 A1 Feb. 3, 2011

(30) Foreign Application Priority Data

Jul. 28, 2009 (JP) ................................. 2009-175626

(51) Int. Cl.
*H05K 5/00* (2006.01)

(52) U.S. Cl.
USPC ................. 361/730; 361/679.04; 361/679.27; 345/60; 345/67; 345/87; 345/89; 345/90; 345/98; 345/204; 345/206; 345/212; 345/690; 349/53; 349/54; 349/58; 349/65; 349/149; 313/422; 313/493; 313/495; 348/796; 204/164

(58) Field of Classification Search
USPC ................. 361/730, 679.04, 679.27; 345/60, 345/67, 87, 89, 90, 98, 204, 206, 212, 690; 349/53, 54, 58, 65, 149; 313/422, 493, 495; 348/796; 204/164
See application file for complete search history.

(56) References Cited

U.S. PATENT DOCUMENTS

| | | | |
|---|---|---|---|
| 6,624,586 B2 | 9/2003 | Abe et al. | 315/169.1 |
| 6,653,794 B2 | 11/2003 | Sagano et al. | 315/169.2 |
| 6,847,338 B2 | 1/2005 | Abe et al. | 345/60 |
| 6,870,522 B2 | 3/2005 | Sagano et al. | 345/75.2 |
| 6,952,193 B2 | 10/2005 | Abe et al. | 345/87 |
| 7,079,161 B2 | 7/2006 | Sagano et al. | 345/690 |
| 7,315,314 B2 | 1/2008 | Sagano et al. | 345/690 |
| 7,417,610 B2 | 8/2008 | Abe et al. | 345/87 |
| 7,808,461 B2 | 10/2010 | Yamazaki et al. | 345/82 |

(Continued)

FOREIGN PATENT DOCUMENTS

| | | |
|---|---|---|
| JP | 04-167409 A | 6/1992 |
| JP | 4-167409 A | 6/1992 |

(Continued)

OTHER PUBLICATIONS

Notification of the First Office Action issued by the State Intellectual Property Office of the People's Republic of China in corresponding Chinese Application No. 201010237369.6 along with English-language translation (17 pages).

*Primary Examiner* — Xiaoliang Chen
(74) *Attorney, Agent, or Firm* — Fitzpatrick, Cella, Harper & Scinto (57) ABSTRACT

A flat display apparatus has a flat display panel; a frame that is installed on a rear face side of the display panel; a cover that covers at least a rear face side of the frame; and a high-voltage power supply that applies high voltage to the display panel. The high-voltage power supply has a plurality of cases, each of which encloses one or more transformers and rectifier circuits, and obtains high voltage by connecting the plurality of cases in series, and the plurality of cases are arranged in a space created between the frame and the cover so as to be disposed on a plane in parallel with a screen of the display panel.

10 Claims, 8 Drawing Sheets

(56) References Cited

U.S. PATENT DOCUMENTS

| | | | |
|---|---|---|---|
| 2003/0122472 A1* | 7/2003 | Kawase | 313/422 |
| 2005/0073621 A1* | 4/2005 | Lee et al. | 349/53 |
| 2005/0206299 A1* | 9/2005 | Nakamura et al. | 313/495 |
| 2007/0195217 A1* | 8/2007 | Miyashita et al. | 349/54 |
| 2008/0007183 A1 | 1/2008 | Tatsumi | 315/160 |
| 2009/0009450 A1 | 1/2009 | Abe et al. | 345/87 |

FOREIGN PATENT DOCUMENTS

| | | |
|---|---|---|
| JP | 2005-19685 A | 1/2005 |
| JP | 2006-156092 A | 6/2006 |
| JP | 2008-4323 A | 1/2008 |
| JP | 2008-004323 A | 1/2008 |

* cited by examiner

FLAT DISPLAY APPARATUS AND HIGH-VOLTAGE POWER SUPPLY

BACKGROUND OF THE INVENTION

1. Field of the Invention

The present invention relates to a flat display apparatus, and more particularly to a circuit configuration of and mounting method for a high-voltage power supply of a flat display apparatus.

2. Description of the Related Art

As a flat display apparatus, an electron beam display apparatus, such as an FED (Field Emission Display), plasma display apparatus and liquid crystal display apparatus are known. For such a flat display apparatus, a high-voltage power supply may be used for applying voltage to the display panel. For example, Japanese Patent Application Laid-open No. 2008-4323 discloses a configuration to dispose a high-voltage power supply for supplying anode voltage to the rear face side of a display panel using a cold cathode electron-emitting device.

Along with demands for a slimmer image display apparatus, a smaller size and slimmer construction of a high-voltage power supply are also demanded. However the downsizing of a high-voltage power supply is not easy, since a booster circuit, to stably generate a desired high voltage, is required. A slimmer apparatus also increases the risk of generating an arc discharge between the high-voltage power supply and peripheral structure. Japanese Patent Application Laid-open No. H4-167409 discloses a configuration for preventing an arc discharge in the high-voltage power supply of a CRT by securing a predetermined spatial distance between a case (outer shell) enclosing a flyback transformer and peripheral structure. However even if the structure disclosed in Japanese Patent Application Laid-open No. H4-167409 is directly applied to the flat display apparatus, demands for a slimmer apparatus cannot be satisfied.

SUMMARY OF THE INVENTION

The present invention provides a high-voltage power supply which suppresses the generation of an arc discharge, and contributes to implementing a slimmer flat display apparatus.

The present invention in its first aspect provides a flat display apparatus, having: a flat display panel; a frame that is installed on a rear face side of the display panel; a cover that covers at least a rear face side of the frame; and a high-voltage power supply that applies high voltage to the display panel, wherein the high-voltage power supply has a plurality of cases, each of which encloses one or more transformers and rectifier circuits, and obtains high voltage by connecting the plurality of cases in series, and the plurality of cases are arranged in a space created between the frame and the cover so as to be disposed on a plane in parallel with a screen of the display panel.

The present invention in its second aspect provides a high-voltage power supply for applying high voltage to a flat display panel in a flat display apparatus having the flat display panel, a frame that is installed on a rear face side of the display panel, and a cover that covers at least a rear face side of the frame, the high-voltage power supply having a plurality of cases, each of which encloses one or more transformers and rectifier circuits, and obtaining high voltage by connecting the plurality of cases in series, and the plurality of cases being arranged in a space created between the frame and the cover so as to be disposed on a plane in parallel with a screen of the display panel.

According to the present invention, a high-voltage power supply which suppresses the generation of an arc discharge and contributes to implementing a slimmer flat display apparatus can be provided.

Further features of the present invention will become apparent from the following description of exemplary embodiments with reference to the attached drawings.

DESCRIPTION OF THE EMBODIMENTS

The present invention is applied to a flat display apparatus, comprising a flat display panel, a frame installed on the rear face side of the display panel, a cover that covers at least the rear face side of the frame, and a high-voltage power supply that applies high voltage to the display panel. As a flat display apparatus, an electron beam display apparatus, plasma display apparatus and liquid crystal display apparatus are known, but the present invention can be applied to any type of display apparatuses which require a high-voltage power supply. The electron beam display apparatus, in particular, is a preferred embodiment of the present invention, since anode voltage of the kilovolt order is used for accelerating electrons. A display panel of an electron beam display apparatus has a rear plate on which a plurality of electron-emitting devices are arranged in a matrix and a face plate on which a fluorescent substance is disposed, and anode voltage is supplied to the face plate. Examples of the electron-emitting device are a surface-conduction electron-emitting device, a field emission type electron-emitting device, and MIM type electron-emitting device. Examples of the field emission type are the Spindt type, the GNF (Graphite Nano-Fiber) type and the CNT (Carbon Nano-Tube) type.

(Configuration of Image Display Apparatus)

An image display apparatus using a surface-conduction electron-emitting device will be described as an example of the flat display apparatus to which the present invention is applied.

Figure 4:
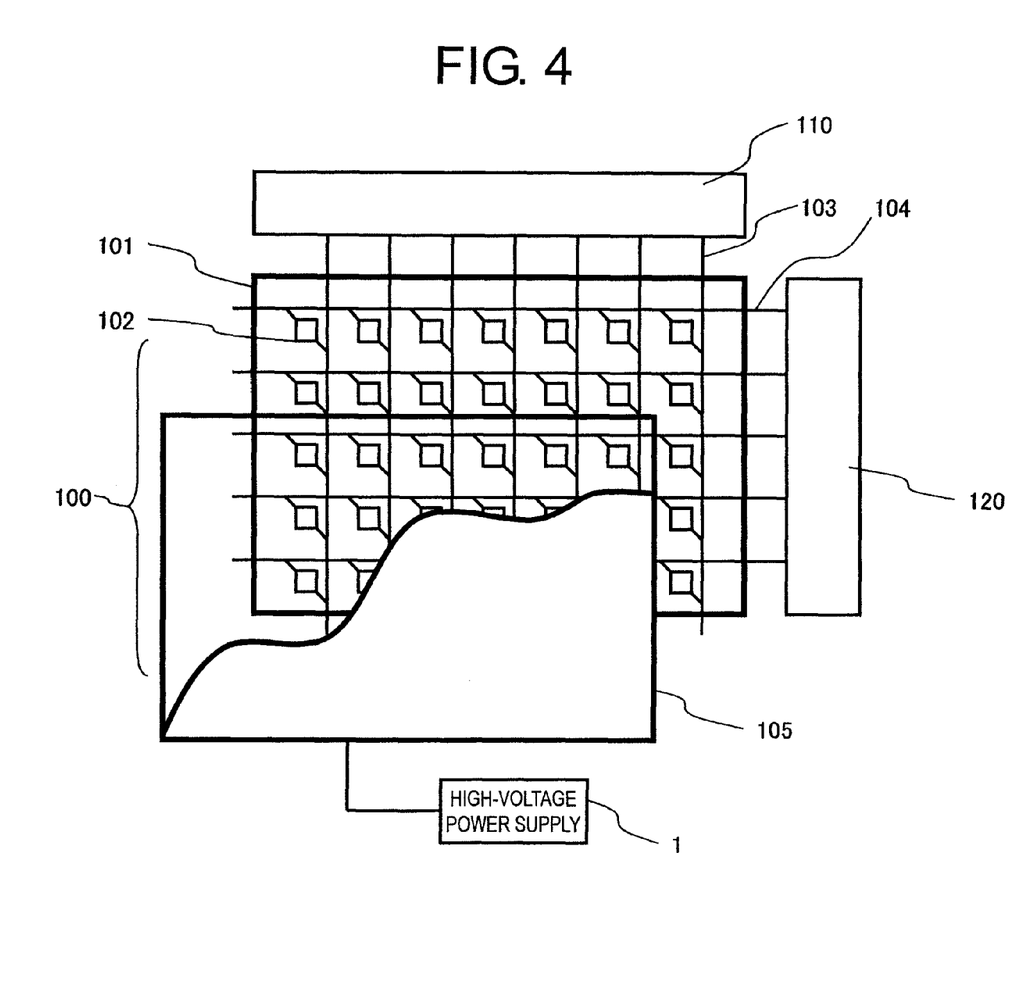
FIG. 4 is a diagram depicting a configuration of the flat display apparatus.

FIG. 4 is a diagram depicting a configuration of the image display apparatus. The image display apparatus has a display panel 100, modulation driver 110, scan driver 120 and high-voltage power supply 1. The display panel 100 has a rear plate 101 and a face plate 105. A plurality of surface-conduction electron-emitting devices 102, a plurality of modulation wirings 103 and a plurality of scan wirings 104 are formed on the rear plate 101. Each electron-emitting device 102 is formed near an intersection of a modulation wiring 103 and a scan wiring 104, and is electrically connected to the modulation wiring 103 and the scan wiring 104. The modulation wiring 103 and the scan wiring 104 are insulated by an insulating layer, which is not illustrated. This structure is called a "simple matrix" structure. A black matrix, a fluorescent substance and metal back (anode electrode), which are not illustrated, are formed on the face plate 105. In FIG. 4, a partially transparent face plate 105 is illustrated to make description easier. The matrix panel 100 is an airtight container, and the space between the rear plate 101 and the face plate 105 is kept in a vacuum, so that emitted electrons can move. The surface of this faceplate 105 is the screen on which an image is displayed.

The high-voltage power supply 1 supplies high voltage to a metal back of the face plate 105 via a high-voltage terminal, which is not illustrated. For the structure of the high-voltage terminal, a known technology (e.g. see Japanese Patent Application Laid-open No. 2006-156092) can be used.

In FIG. 4, scan wirings 104 are sequentially selected corresponding to a horizontal synchronization signal of an image signal. During the selection period, a predetermined selection potential (selection signal) is supplied from the scan driver 120. On the other hand, modulation signals corresponding to luminance data of an image signal are supplied from the modulation driver 110 to the modulation wirings 103. Thereby drive voltage, which is a potential difference between the selection signal and modulation signal, is applied to each of the electron-emitting device 102 of a selected line, and electrons are emitted. Then the corresponding one line of fluorescent substance emits light with luminance according to the luminance data. By performing this operation for all the lines, one screen image is formed. The modulation method of the modulation driver 110 may be any one of pulse width modulation, amplitude (pulse height) modulation, and combination of pulse width modulation and amplitude modulation.

The high-voltage power supply 1 applies voltage (anode voltage) for accelerating the electrons emitted by the electron-emitting device 102 to the metal back of the face plate 105 in order to obtain desired luminance (brightness). In the image display apparatus under development by the present inventors, the voltage of the high-voltage power supply 1 is preferably around 12 kV. The voltage of the high-voltage power supply 1 is determined by the required luminance (brightness), a value of current emitted by the electron-emitting device, a number of pixels to be displayed, among other factors, and may have a voltage value other than 12 kV.

(Mounting of High-Voltage Power Supply)

Figure 5:
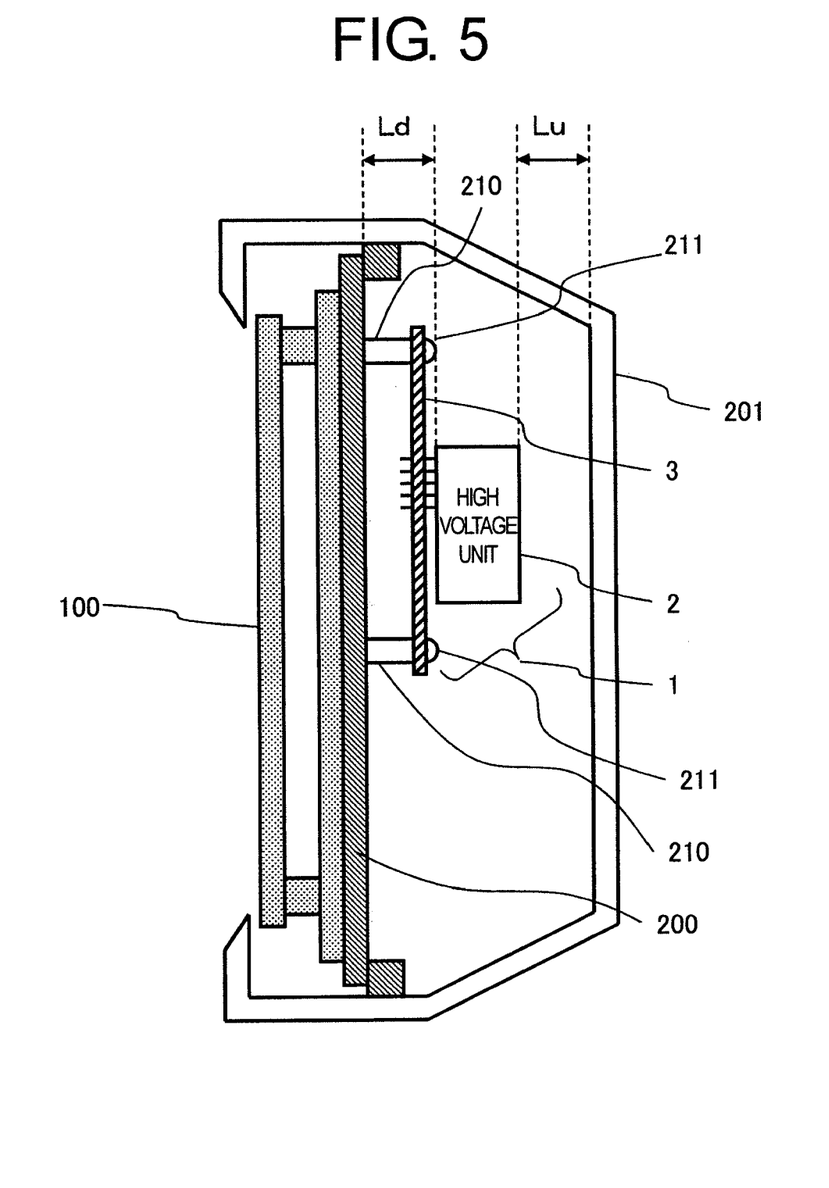
FIG. 5 is a cross-sectional view depicting amounted state and spatial distance of the high-voltage power supply of the flat display apparatus.

A method for mounting the high-voltage power supply of the flat display apparatus will be described with reference to FIG. 5. FIG. 5 is a cross-sectional view depicting a mounted state and spatial distance of a high-voltage power supply of an image display apparatus. The horizontal direction of FIG. 5 indicates the thickness direction of the image display apparatus (direction perpendicular to the screen), and the left side of FIG. 5 is the front face side, and right side thereof is the rear side. The frame 200 formed of such conductive material as metal is installed on the rear face side of the flat display panel 100. This frame 200 is a supporting member to support the display panel 100 and provide rigidity to the entire apparatus. A circuit board including a drive circuit, which is not illustrated, and high-voltage power supply 1 as well is installed on the frame 200. The reference number 201 denotes a cover of the image display apparatus. The cover 201 covers an area from the circumference (portion after excluding the screen) of the display panel 100 to the rear face side of the frame 200. This cover 201 as well is formed of such conductive material as metal. The frame 200 and cover 201 are maintained at ground potential.

The high-voltage power supply 1 is disposed in a space created between the frame 200 and cover 201. The high-voltage power supply 1 is comprised of a high-voltage unit case 2 and a printed circuit board 3. The high-voltage unit case 2 encloses a high-voltage circuit portion of the high-voltage power supply 1, and insulating and impregnating material is filled into the case (outer shell). Circuits other than the high-voltage circuit portion of the high-voltage power supply 1 are mounted on the printed circuit board 3. The printed circuit board 3 is installed on the frame 200 via the spacers 210. Reference numeral 211 designates screws for securing the printed circuit board 3. In order to suppress an arc discharge of the high-voltage power supply 1, the height of the spacer 210 and the shape of the cover 201 are designed so as to create desired spatial distances Ld and Lu. Ld is a spatial distance between the high voltage unit case 2 and frame 200, and Lu is a spatial distance between the high voltage unit case 2 and cover 201.

(Examination of Spatial Distance)

The desired spatial distances Ld and Lu, required for the high-voltage power supply, will now be described.

Figure 6:
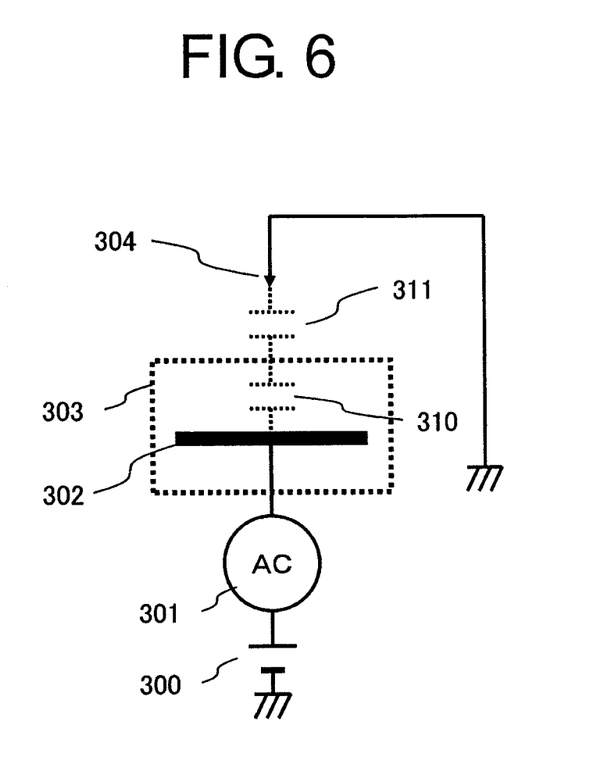
FIG. 6 is a diagram depicting a configuration of an experiment apparatus for checking the spatial distance.

FIG. 6 is a diagram depicting an experiment apparatus for checking the spatial distance. In FIG. 6, 300 is a DC power supply, 301 is an AC power supply, 302 is a high-voltage electrode, and 303 is an insulating case enclosing the high-voltage electrode 302. An insulating and impregnating material is filled into the outer shell of the insulating case 303, whereby a necessary DC withstand voltage is implemented. Reference numeral 304 designates a test probe, which is a ground potential. Reference numeral 310 designates an equivalent capacitance between the high-voltage electrode 302 and the surface of the outer shell of the insulating case 303, and 311 is an equivalent capacitance between the surface of the outer shell of the insulating case 303 and the test probe 304.

Figure 7:
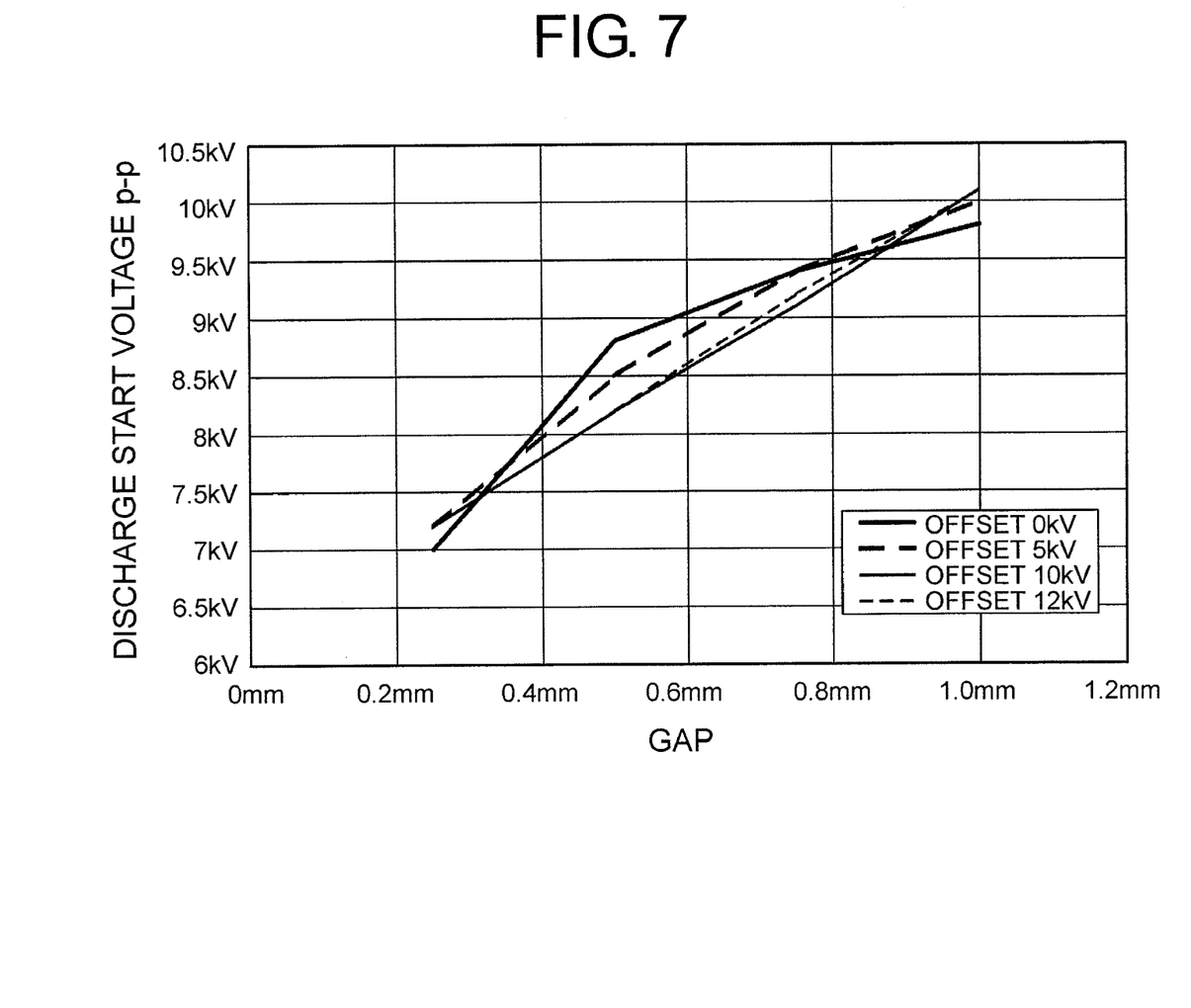
FIG. 7 is a graph depicting an experiment result of the spatial distance.

Using the experiment apparatus in FIG. 6, a peak-to-peak voltage (discharge start voltage p-p) of the AC power supply 301, at which a sustained corona discharge starts, and the distance (gap) between the test probe 304 and insulating case 303, are measured. FIG. 7 shows a graph on the experiment result when the voltage (offset voltage) of the DC power supply 300 is changed. As FIG. 7 shows, the voltage, at which a sustained corona discharge starts, is determined not by the DC voltage (offset voltage), but by the AC voltage alone (discharge start voltage p-p).

The corona discharge by the DC voltage can be completely prevented by filling with impregnating material. In the case of AC voltage, however, current flows due to the equivalent capacitances 310 and 311 shown in FIG. 6. In this case, as spatial distance becomes smaller, the equivalent capacitance 311 increases, therefore impedance decreases, and the possibility for a corona discharge to be sustained by the AC voltage increases.

The spatial distance at which corona discharge starts is as follows.

(1) If the DC withstand voltage is secured, the spatial distance at which corona discharge starts is determined by AC voltage (DC voltage is unrelated).

(2) An insulator has a higher relative static permittivity than space (air), so if an insulator is inserted into the space between the case and another member (frame 200, cover 201), the equivalent capacitance 311 increases. Hence the distance between the case and the other member (total of the thickness of the insulator and spatial distance) must be set to be longer than the spatial distance in the case of an insulator not inserted.

If a corona discharge is sustained, the interface of the insulating case 303 or the like deteriorates, and if the deterioration advances, it is possible that the corona discharge turns into an arc discharge. Therefore the corona discharge must be prevented by decreasing the equivalent capacitances 310 and 311. For the equivalent capacitance 310, an impregnating material can be selected and designed according to the DC withstand voltage that is required. To suppress the corona discharge, the equivalent capacitance 311 in the space must be small. In other words, a corona discharge is prevented by securing the spatial distance between the case and other members.

As described above, in order to guarantee reliability, a spatial distance at which a corona discharge is not generated must be secured. In an actual product, desired spatial distances Ld and Lu are determined by adding the design margins to the distance where a corona discharge is not generated, and a high-voltage power supply is mounted so that the spatial distances Ld and Lu can be secured.

(Spatial Distance of High-Voltage Power Supply)

The spatial distance required for the high-voltage power supply is examined.

Figure 8A:
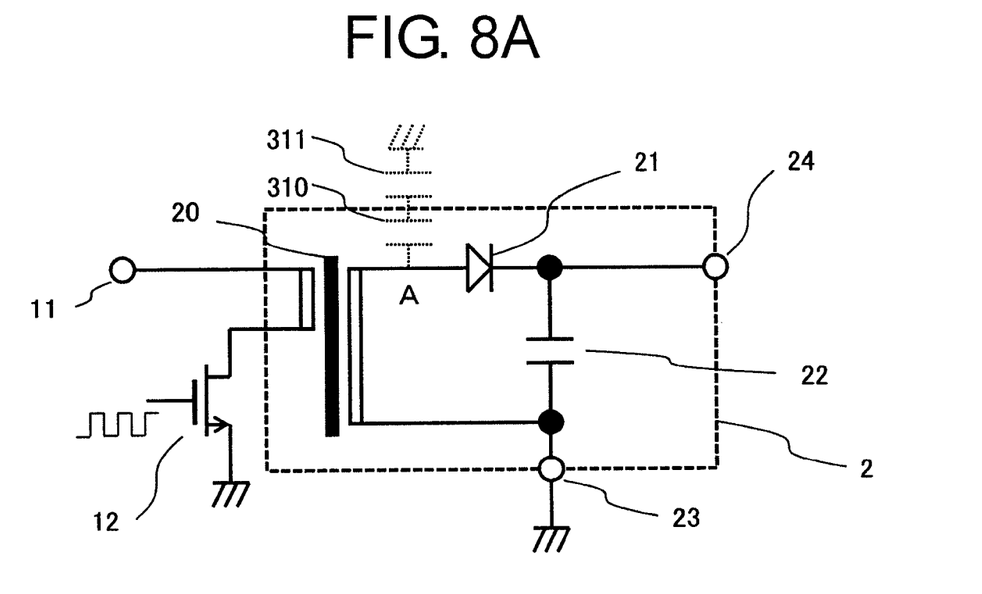
FIG. 8A is a circuit diagram depicting a major portion of the high-voltage power supply.
Figure 8B:
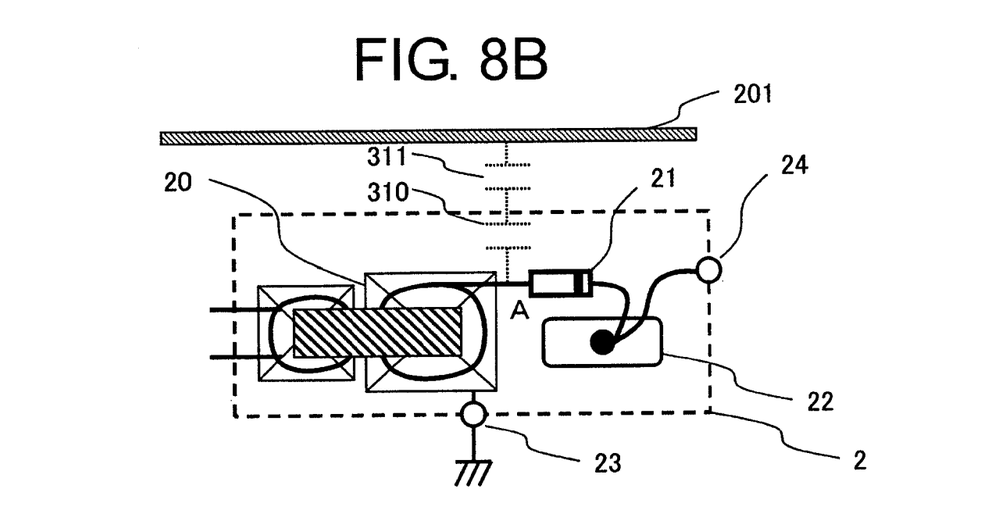
FIG. 8B is a diagram depicting amounted state of the circuit components of the high-voltage power supply.

FIG. 8A is a circuit diagram depicting a major portion of the high-voltage power supply. FIG. 8B is a diagram depicting the mounting of circuit components of the high-voltage power supply. A 150 V DC voltage, for example, is applied to a primary side power supply input terminal 11. Reference numeral 12 designates a transistor, such as an FET. The transistor 12 turns the primary side power supply ON/OFF with a several 10 kHz high frequency, for example. Reference Numeral 20 designates a flyback transformer. The flyback transformer 20 outputs the energy, which is stored when the transistor 12 is ON, from a secondary winding when the transistor 12 is OFF. The high-voltage diode 21 rectifies the output of the flyback transformer 20. The capacitor 22 smoothes the output rectified by the high-voltage diode 21. The low potential side terminal 23 is connected to the ground potential. The high potential side terminal 24 is a terminal for outputting the boosted DC voltage. The high voltage circuit portion, such as a transformer and rectifying circuit, is covered with the outer shell of the high-voltage unit case 2. The inside of the high-voltage unit case 2 is filled with impregnating material having a sufficient withstand voltage against DC voltage. The high-voltage unit case 2 is disposed with a predetermined spatial distance from the conductive cover 201, which is maintained at the ground potential.

As mentioned above, corona discharge is determined by the AC voltage. In the high-voltage power supply illustrated in FIG. 8A and FIG. 8B, the AC voltage at node A is high, and has a peak-to-peak voltage, which is equivalent to the DC voltage to be output to the high-potential side terminal 24 of the high-voltage power supply.

The start voltage of the corona discharge is determined by the equivalent capacitance 310 of the impregnating material at node A where the AC voltage is high, and the equivalent capacitance 311 in a nearby space. The desired spatial distance is determined by adding the design margins to the spatial distance where a corona discharge is not generated (that is, the equivalent capacitance 311 of the space). In FIG. 8B, the spatial distance from the cover 201 is shown to enhance understanding, but the spatial distance from the frame 200 is also determined in the same manner.

As FIG. 5 shows, if the high voltage to be applied to the display panel 100 is obtained by the high-voltage power supply 1 constituted by a single high-voltage unit case 2, the AC voltage in the high-voltage unit case 2 becomes very high. Therefore sufficient spatial distances Ld and Lu are required between the high-voltage unit case 2 and frame 200, and between the high-voltage unit case 2 and cover 201, which makes it difficult to slim down the image display apparatus.

As a result of examining a way of slimming the high-voltage power supply, including the spatial distance, to slim down an image display apparatus, the present inventors discovered that the following configuration is preferable.

Each voltage is boosted to a voltage lower than the target high voltage (voltage to be applied to the display panel) using a plurality of transformers. Rectification is performed for each transformer, and DC voltage is obtained from each transformer.

A plurality of transformers and rectifier circuits are packaged into (not one high-voltage unit case but) a plurality of high-voltage cases.

DC voltage rectified for each transformer is connected in a series, and target high voltage is obtained.

The plurality of high-voltage unit cases are arranged so as to be disposed on a plane in parallel with the screen of the display panel.

The above configuration is preferable to slim down the high-voltage power supply and the image display apparatus. This configuration not only decreases the spatial distance between the high-voltage power supply and the frame or the cover, but also decreases the power per transformer since a plurality of transformers are used. As a result, the sectional area of the core of the transformer can be decreased, and can, as a consequence, make the high-voltage unit case itself smaller and slimmer. This aspect also contributes to slimming the image display apparatus.

Now embodiments of the present invention will be described in detail. In the following description, configuration portions unique to the embodiments of the present invention will be described in detail, but description on portions that are the same as the above configuration (e.g. basic configuration of image display apparatus) will be omitted.

(First Embodiment)

Figure 1:
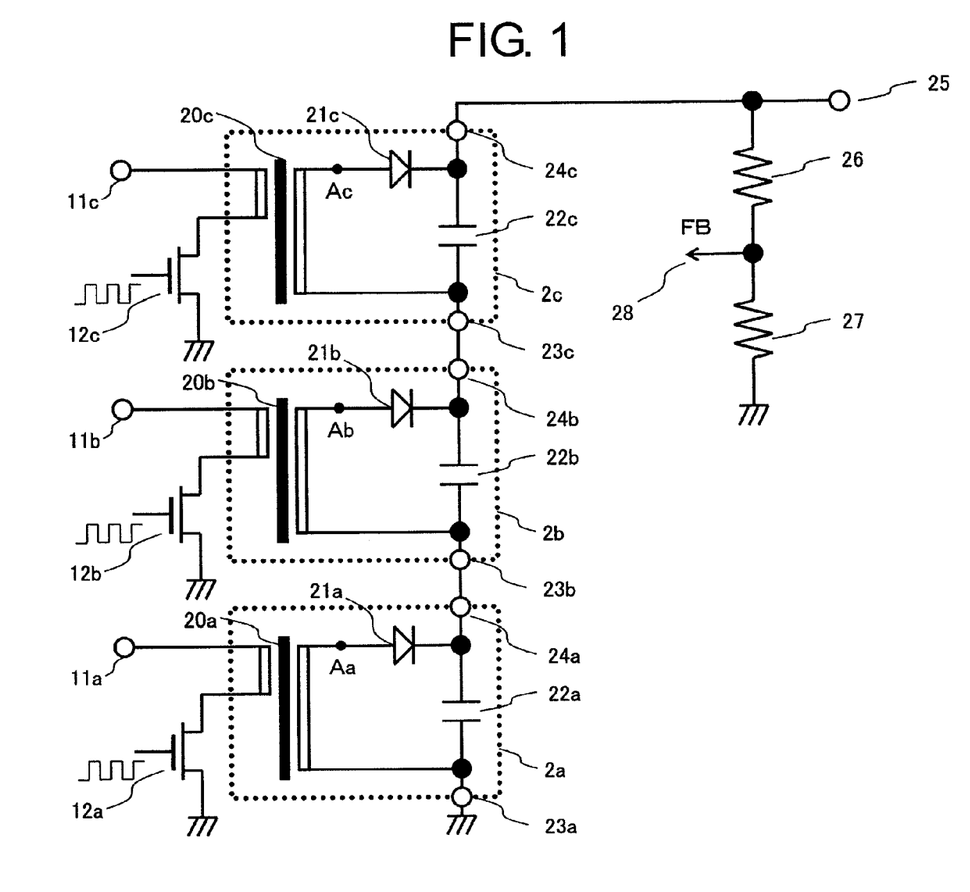
FIG. 1 is a circuit diagram depicting a major portion of the high-voltage power supply of the first embodiment.

FIG. 1 is a circuit diagram depicting a major portion of the high-voltage power supply of the first embodiment of the present invention. This high-voltage power supply has three high-voltage unit cases 2a, 2b and 2c. The three high-voltage unit cases have essentially the same circuit configuration.

The high-voltage unit case 2a (2b, 2c) has a primary side power supply input terminal 11a (11b, 11c). A 150 V DC voltage, for example, is applied to the primary side power supply input terminal 11a (11b, 11c). Reference numeral 12a (12b, 12c) designates a transistor, such as an FET, that is mounted on the printed circuit board 3. The transistor 12a (12b, 12c) is a switch to turn the primary side power supply ON/OFF with a several 10 kHz high frequency. Reference numeral 20a (20b, 20c) designates a flyback transformer. The flyback transformer 20a (20b, 20c) outputs energy, which is stored when the transistor 12a (12b, 12c) is ON, from a secondary winding when the transistor 12a (12b, 12c) is OFF. A high-voltage diode 21a (21b, 21c) rectifies the output of the flyback transformer 20a (20b, 20c). A capacitor 22a (22b, 22c) smoothes the output rectified by the high voltage diode 21a (21b, 21c). A circuit comprised of the high-voltage diode and the capacitor is called a "rectifier circuit". Reference numeral 23a (23b, 23c) designates a low potential side terminal of a secondary circuit, and 24a (24b, 24c) designates a high potential side terminal of the secondary circuit.

The high-voltage circuit portion, such as a transformer and rectifier circuit, is covered with an outer shell of the high-voltage unit case 2a (2b, 2c). The inside of the high-voltage unit case 2a (2b, 2c) is filled with insulating and impregnating material having a sufficient withstand voltage against DC voltage (also called a mold material, sealing material or filler). For the impregnating material, an epoxy resin, for example, is preferable. Reference numeral 25 designates an output terminal of the high-voltage power supply, and the high voltage is supplied from this output terminal 25 to a face plate of the display panel 100.

The three high-voltage unit cases 2a, 2b and 2c, are connected in series. In other words, the low potential side terminal 23a of the high-voltage unit case 2a is connected to the ground potential, and the high potential side terminal 24a is connected to the low potential side terminal 23b of the high-voltage unit case 2b. The high potential side terminal 24b of the high-voltage unit case 2b is connected to the low potential side terminal 23c of the high-voltage unit case 2c, and the high-voltage side terminal 24c of the high-voltage unit case 2c is connected to the output terminal 25. Thereby the output voltage of each high-voltage unit case is combined, and the target high voltage can be obtained.

Voltage dividing resistors 26 and 27 are for dividing the voltage of the output terminals 25 at a desired ratio. The potential obtained by dividing voltage is fed back to the control circuit, which is not illustrated, via the output node 28 (negative feedback). The control circuit controls the gate of the transistor 12a (12b, 12c) so that the potential of the output node 28 becomes the same as the reference potential, which is not illustrated. Compared with the configuration in which negative feedback is performed on individual transformers, the advantage of this configuration is that insulation between the primary circuit and the secondary circuit of the transformer is unnecessary. Another advantage is that only one system is required for negative feedback, which simplifies the circuit configuration. The control circuit for feedback control can be constructed using an operational amplifier or the like. It is preferable that the voltage dividing resistors 26 and 27 are inserted in a case that is different from the three high-voltage unit cases 2a, 2b and 2c, and the inside of the outer shell thereof is filled with an insulating and impregnating material, which has sufficient withstand voltage against DC voltage. It is also preferable to connect such a smoothing capacitor as a film capacitor to this case in parallel if necessary, in order to decrease the ripple voltage.

In this embodiment, three transformers are used as an example, but the number of transformers can be two or four or more to expect the effect of the present invention. In terms of manufacturing cost, an appropriate number of transformers is ten or less. The appropriate number of transformers is determined by the voltage and current to be supplied to the face plate and the required thickness. In the case of the image display apparatus using the surface-conduction electron-emitting device, which the present inventors are developing, the output voltage of the high-voltage power supply is 12 kV, and the appropriate number of transformers is three to six. For example, in the case of the configuration using three transformers, as shown in FIG. 1, if the target output voltage is 12 kV, the output voltage of each transformer can be designed to be 4 kV.

In the configuration shown in FIG. 1, the nodes of which the AC voltage is high are node Aa, node Ab and node Ac. The AC voltage at these nodes is ⅓ of the voltage required for boosting using a single transformer. In other words, since an AC voltage to determine the start of a corona discharge is lower, the spatial distances Ld and Lu can be decreased compared to the configuration of a single transformer.

Figure 2:
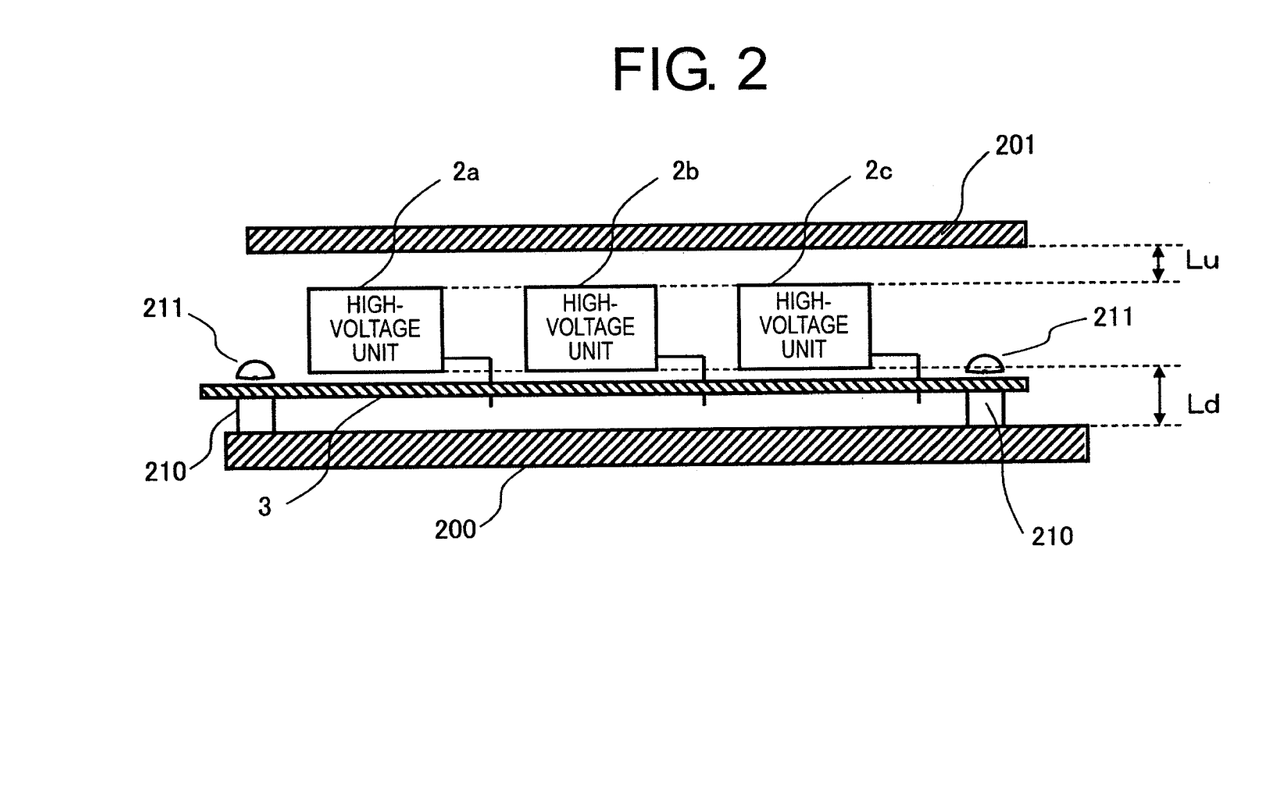
FIG. 2 is a diagram depicting a mounted state of the high-voltage power supply of the first embodiment.

FIG. 2 shows a mounting state of the high-voltage power supply according to the first embodiment of the present invention. The vertical direction in FIG. 2 shows the thickness direction of the image display apparatus (direction perpendicular to the screen), the bottom side in FIG. 2 is the front face side, and the top side is the rear face side. The high-voltage power supply is disposed in the space created between the frame 200 and cover 201. The high-voltage power supply is comprised of the printed circuit board 3 and three high-voltage unit cases 2a, 2b and 2c, mounted on the printed circuit board 3. The printed circuit board 3 is secured to the frame 200 via the spacers 210 by screws 211. Here the three high-voltage unit cases 2a, 2b and 2c, are arranged to be disposed on a plane in parallel with the screen of the display panel. In other words, the three high-voltage unit cases 2a, 2b and 2c, are in a same position (or substantially same position) in the thickness direction. In this case, the height of the spacers 210 and the shape of the cover 201 are designed so that the desired spatial distances Ld and Lu are created between the high-voltage cases 2a, 2b and 2c, and the frame 200 or cover 201. In the printed circuit board 3, it is better not to dispose conductive members, such as wirings, in the area between the high-voltage unit cases 2a, 2b and 2c and the frame 200. In this example, the spacer 210 is a separate member from the frame 200, but may be created by partially bending the plate of the frame 200. Any structure can be used only if the printed circuit board 3 can be secured in a predetermined position by which the spatial distances Ld and Lu can be secured.

According to the above mentioned configuration of the present embodiment, the spatial distances Ld and Lu to be secured around each high-voltage unit case can be decreased than the prior art, because the AC voltage in each high-voltage unit case is decreased. In addition, the sectional area of the core of the transformer can be decreased, therefore, as a result, the high-voltage unit case itself can be smaller and slimmer. Consequently a major slimming of the image display apparatus becomes possible.

(Second Embodiment)

Figure 3:
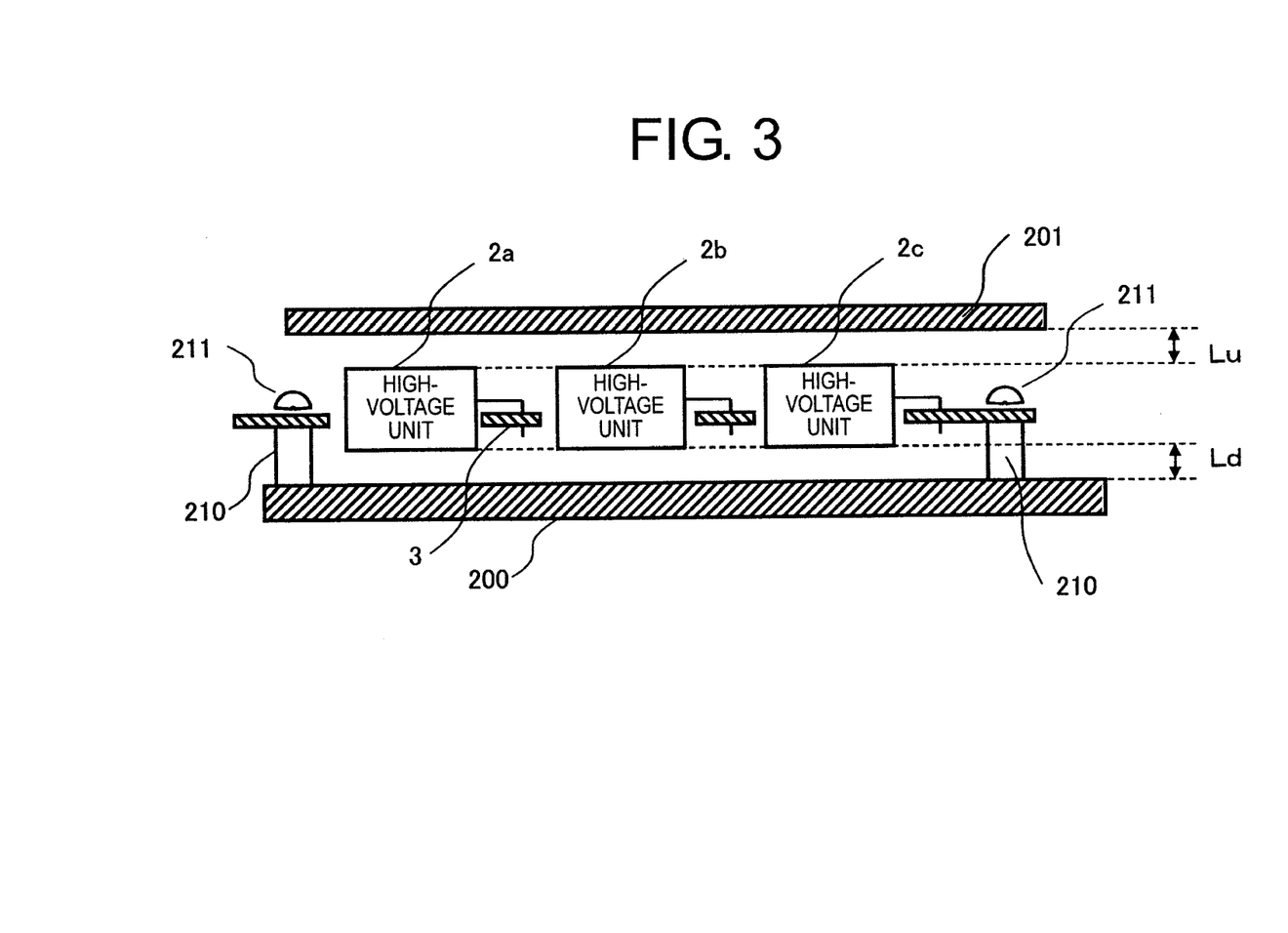
FIG. 3 is a diagram depicting a mounted state of the high-voltage power supply of the second embodiment.

FIG. 3 shows an embodiment of a high-voltage power supply according to the second embodiment of the present invention.

The circuit configuration of the high-voltage power supply of the second embodiment is the same as that of the first embodiment shown in FIG. 1. In FIG. 3, a composing element the same as the first embodiment is denoted with a same reference symbol.

The difference of the high-voltage power supply of the second embodiment from the first embodiment is that a plurality of openings are created in the printed circuit board 3, and each high-voltage unit case is disposed in the opening. The rest of the first embodiment is the same as the second embodiment.

According to the configuration of the present embodiment, the thickness of the printed circuit board 3, having a high relative static permittivity, is removed from the spatial distance between the high-voltage cases 2a, 2b and 2c and case 200. Therefore compared with the first embodiment, the spatial distance Ld can be decreased further, and the image display apparatus can be slimmer yet.

According to the present embodiment, the high-voltage case can be smaller and lighter since the transformer is divided. Thereby the mounting form shown in FIG. 3 becomes possible. In other words, if one high-voltage unit case is used, a large size and heavy weight are required for the high-voltage unit case, in order to obtain the necessary power. Therefore creating openings in the printed circuit board is difficult in terms of rigidity and vibration testing. Whereas according to the present embodiment, the high-voltage unit case is small and light, which makes it possible to create openings in the printed circuit board.

In other words, the opening of the printed circuit board may be a cutout portion that is created from the periphery of the printed circuit board. In other words, any shape of the opening can be used, only if the printed circuit board is not positioned between the high-voltage unit case and the frame.

(Other Embodiments)

In the above embodiment, an example of boosting performed by the flyback type DC/DC converter was shown, but the present invention can be applied to a forward type and other types of circuit configuration. As the rectifier circuit, it is preferable to use a voltage-doubler rectifier circuit. This is because the AC voltage can be decreased with respect to the output voltage of the high-voltage power supply, and the spatial distance can be decreased.

In the above embodiment, one transformer is packaged in one high-voltage unit case respectively, but two or more transformers connected in series may be packaged in each high-voltage unit case. If a number of high-voltage unit cases is decreased, cost can be decreased.

In the above embodiment, a cover 201 made from conductive material is used, but a resin cover may be used. In this case, a conductive shield plate can be disposed between the resin cover and the high-voltage power supply. In this case, it is designed such that the distance between the high-voltage unit case and the shield plate satisfies the desired spatial distance Lu.

In the above embodiment, a plurality of high-voltage unit cases are disposed one dimensionally, but may be disposed two dimensionally on a plane in parallel with the screen of the display panel. Here "a plane in parallel with the screen" includes not only a plane that is strictly (mathematically and geometrically) in parallel, but a plane that is substantially in parallel. For example, if bumps are on the frame 200 or if the frame 200 is slightly inclined with respect to the screen, due to a physical restriction or design restriction, it may be difficult to dispose the high-voltage unit cases strictly in parallel with the screen. However, if a plurality of high-voltage unit cases are arranged roughly in parallel with the screen, then the requirement for slimming, which is the target of the present invention, can be implemented. Therefore "a plane in parallel with the screen" refers to "a plane along the screen".

In the above embodiment, an example of applying the present invention to the image display apparatus using the surface-conduction electron-emitting device was described, but the present invention can be applied to all kinds of flat display apparatuses that require high voltage.

Another effect of the present invention is that cost can be decreased by mass production, since a plurality of high-voltage unit cases having a same configuration are used. The maintenance parts, such as the high-voltage unit case, can be smaller, which decreases management cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-175626, filed on Jul. 28, 2009, which is hereby incorporated by reference herein in its entirety.

What is claimed is:

1. A flat display apparatus, comprising:
a flat display panel;
a frame that is installed on a rear face side of the display panel;
a cover that covers at least a rear face side of the frame; and
a high-voltage power supply that applies high voltage to the display panel, wherein
the high-voltage power supply has a plurality of cases, each of which encloses one or more transformers and rectifier circuits, and obtains high voltage by connecting the plurality of cases in series, and
the plurality of cases are arranged in a space created between the frame and the cover so as to be disposed on a plane in parallel with a screen of the display panel.

2. The flat display apparatus according to claim 1, wherein each of the cases is arranged to maintain predetermined spatial distances from the frame and the cover.

3. The flat display apparatus according to claim 1, wherein the high-voltage power supply further has a voltage dividing resistor that divides the high voltage that is output from the high-voltage power supply, and a control circuit that controls the output voltage of each of the cases by feeding back a potential obtained by dividing voltage.

4. The flat display apparatus according to claim 1, wherein the high-voltage power supply has a printed circuit board that is installed in the frame via a spacer,
the printed circuit board has an opening, and
each of the cases is disposed in the opening and mounted on the printed circuit board.

5. The flat display apparatus according to claim 1, wherein inside of the case is filled with insulating and impregnating material.

6. A high-voltage power supply for applying high voltage to a flat display panel in a flat display apparatus having the flat display panel, a frame that is installed on a rear face side of the display panel, and a cover that covers at least a rear face side of the frame,
the high-voltage power supply having a plurality of cases, each of which encloses one or more transformers and rectifier circuits, and obtaining high voltage by connecting the plurality of cases in series, and
the plurality of cases being arranged in a space created between the frame and the cover so as to be disposed on a plane in parallel with a screen of the display panel.

7. The high-voltage power supply according to claim 6, wherein each of the cases is arranged to maintain predetermined spatial distances from the frame and the cover.

8. The high-voltage power supply according to claim 6, further comprising:
a voltage dividing resistor that divides the high voltage that is output from the high-voltage power supply; and
a control circuit that controls output voltage of each of the cases by feeding back a potential obtained by dividing voltage.

9. The high-voltage power supply according to claim 6, further comprising a printed circuit board that is installed in the frame via a spacer, wherein
the printed circuit board has an opening, and
each of the cases is disposed in the opening and mounted on the printed circuit board.

10. The high-voltage power supply according to claim 6, wherein inside of the case is filled with insulating and impregnating material.

* * * * *